(12) United States Patent
Numano

(10) Patent No.: US 8,405,429 B2
(45) Date of Patent: Mar. 26, 2013

(54) POWER SUPPLY VOLTAGE MONITOR CIRCUIT

(75) Inventor: Masaru Numano, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 13/117,429

(22) Filed: May 27, 2011

(65) Prior Publication Data

US 2011/0316619 A1    Dec. 29, 2011

(30) Foreign Application Priority Data

Jun. 23, 2010 (JP) ................................. 2010-143175

(51) Int. Cl.
H03K 5/153 (2006.01)
(52) U.S. Cl. .......................................... 327/77; 327/143
(58) Field of Classification Search ..................... 327/65, 327/77–79, 142–143, 198
See application file for complete search history.

(56) References Cited

U.S. PATENT DOCUMENTS

| | | | |
|---|---|---|---|
| 7,274,226 B2 * | 9/2007 | Yoshizawa | 327/143 |
| 7,646,222 B2 * | 1/2010 | Ichikawa et al. | 327/143 |
| 2004/0263216 A1 * | 12/2004 | Proll et al. | 327/78 |

FOREIGN PATENT DOCUMENTS

JP    2003-315381    11/2003

OTHER PUBLICATIONS

Inverter for Air Conditioner, IGBT/Power MOS FET Gate Drive, Industrial Inverter; Toshiba Photocoupler GaAIAs IRED + Photo IC TLP351; Toshiba opto couplers TLP351, 701 sold in 2002; Jun. 17, 2010; pp. 1-9.

* cited by examiner

*Primary Examiner* — Quan Tra
(74) *Attorney, Agent, or Firm* — Turocy & Watson, LLP

(57) ABSTRACT

According to one embodiment, a power supply voltage monitor circuit includes a constant voltage circuit, a level shift circuit, a clamping circuit, a first differential circuit, and a second differential circuit. The first differential circuit include a differential unit receiving a constant current supplied from a current source and outputting an output voltage in accordance with a potential difference between a first input voltage obtained by subjecting the second constant voltage to resistive division and a second input voltage obtained by subjecting the power supply voltage to resistive division, and an output unit outputting a rectangular signal in accordance with the output voltage of the differential unit. The second differential circuit turns off the current source of the differential unit depending on a potential difference between the first constant voltage and the first input voltage to thereby control the output operation of the output unit, in a case where the clamping circuit does not fix the first constant voltage. On the other hand, The second differential circuit turns on the current source of the differential unit depending on a potential difference between the clamping voltage and the first input voltage.

6 Claims, 6 Drawing Sheets though the voltage characteristics of n transistors provided to the constant voltage circuit 1, the voltage V1 starts to increase when the power supply voltage Vcc becomes n (n is an integer) times as large as a base-emitter voltage Vbe (point A). Thus, in the case of increasing the power supply voltage Vcc from 0 V, the voltage V1 exceeds the voltage V2 (point B) before the voltage V1 becomes stable (point C). This causes an erroneous output of the RST signal during a time from the point A to the point B. Causing such an erroneous output leads to erroneous execution of the UVLO function by the power supply voltage monitor circuit. As a result, the operation of the whole system becomes unstable.

In this regard, it is possible to control the output signal of the comparator 2 by detecting the point C at which the voltage V1 becomes stable. However, the constant voltage circuit 1 varies from one product to another due to fabrication variations, and it is therefore difficult to accurately figure out the point C at which the voltage V1 becomes stable.

POWER SUPPLY VOLTAGE MONITOR CIRCUIT

CROSS-REFERENCE TO RELATED APPLICATIONS

This application is based upon and claims the benefit of priority from the prior Japanese Patent Application No. 2010-143175, filed on Jun. 23, 2010; the entire contents of which are incorporated herein by reference.

FIELD

Embodiments described herein relate generally to a power supply voltage monitor circuit.

BACKGROUND

A power supply voltage monitor circuit, including an UVLO (under voltage lock out function), can prevent an internal circuit of an IC from performing an abnormal operation, in a case where the power supply voltage drops to or below a level above which the internal circuit can operate. Specifically, a power supply voltage monitor circuit monitors a constant voltage circuit inside an IC. When a power supply voltage Vcc is equal to or lower than the output of the constant voltage circuit, the power supply voltage monitor circuit locks out the operation of the constant voltage circuit. On the other hand, when the power supply voltage Vcc is equal to or higher than the output of the constant voltage circuit, the power supply voltage monitor circuit cancels UVLO and allows the constant voltage circuit to operate normally.

FIG. 5 is one example of such a conventional power supply voltage monitor circuit. A constant voltage Vref outputted from a constant voltage circuit 1 undergoes resistive division by means of resistors R1 and R2 and becomes a voltage V1 at a node a between the resistors R1 and R2. Meanwhile, a power supply voltage Vcc undergoes resistive division by means of resistors R3 and R4 and becomes a voltage V2 at a node b between the resistors R3 and R4. Through a comparison between these voltages V1 and V2, a comparator 2 outputs an output signal Vo indicating the detection of a decrease in the power supply voltage Vcc to thereby output an RST signal, which is a digital signal.

The above-described conventional power supply voltage monitor circuit has the following problem. FIG. 6A shows the rise characteristics of the voltages V1 and V2 in a case of increasing the power supply voltage Vcc from 0 V. FIG. 6B shows a timing chart of the RST signal in the same case. As shown in FIG. 6A, the voltage V2 shows an increase substantially proportional to the increase of the power supply voltage Vcc. On the other hand, due to an influence of the voltage characteristics of n transistors provided to the constant voltage circuit 1, the voltage V1 starts to increase when the power supply voltage Vcc becomes n (n is an integer) times as large as a base-emitter voltage Vbe (point A). Thus, in the case of increasing the power supply voltage Vcc from 0 V, the voltage V1 exceeds the voltage V2 (point B) before the voltage V1 becomes stable (point C). This causes an erroneous output of the RST signal during a time from the point A to the point B. Causing such an erroneous output leads to erroneous execution of the UVLO function by the power supply voltage monitor circuit. As a result, the operation of the whole system becomes unstable.

BRIEF DESCRIPTION OF THE DRAWINGS

FIG. 2A is a characteristic chart showing the rise characteristics of a reference voltage V1 and a constant voltage V2 in a case of increasing a power supply voltage Vcc from 0 V, according to the first embodiment. FIG. 2B is a waveform diagram showing a timing chart of an RST signal according to the first embodiment.

FIG. 4A is a characteristic chart showing the rise characteristics of a reference voltage V1 and a constant voltage V2 in a case of increasing a power supply voltage Vcc from 0 V, according to the second embodiment. FIG. 4B is a waveform diagram showing a timing chart of an RST signal according to the second embodiment.

FIG. 6A is a characteristic chart showing the rise characteristics of a voltage V1 and a voltage V2 in a case of increasing a power supply voltage Vcc in the conventional circuit from 0 V. FIG. 6B is a waveform diagram showing a timing chart of an output RST signal in the conventional circuit.

DETAILED DESCRIPTION

Figure 1:
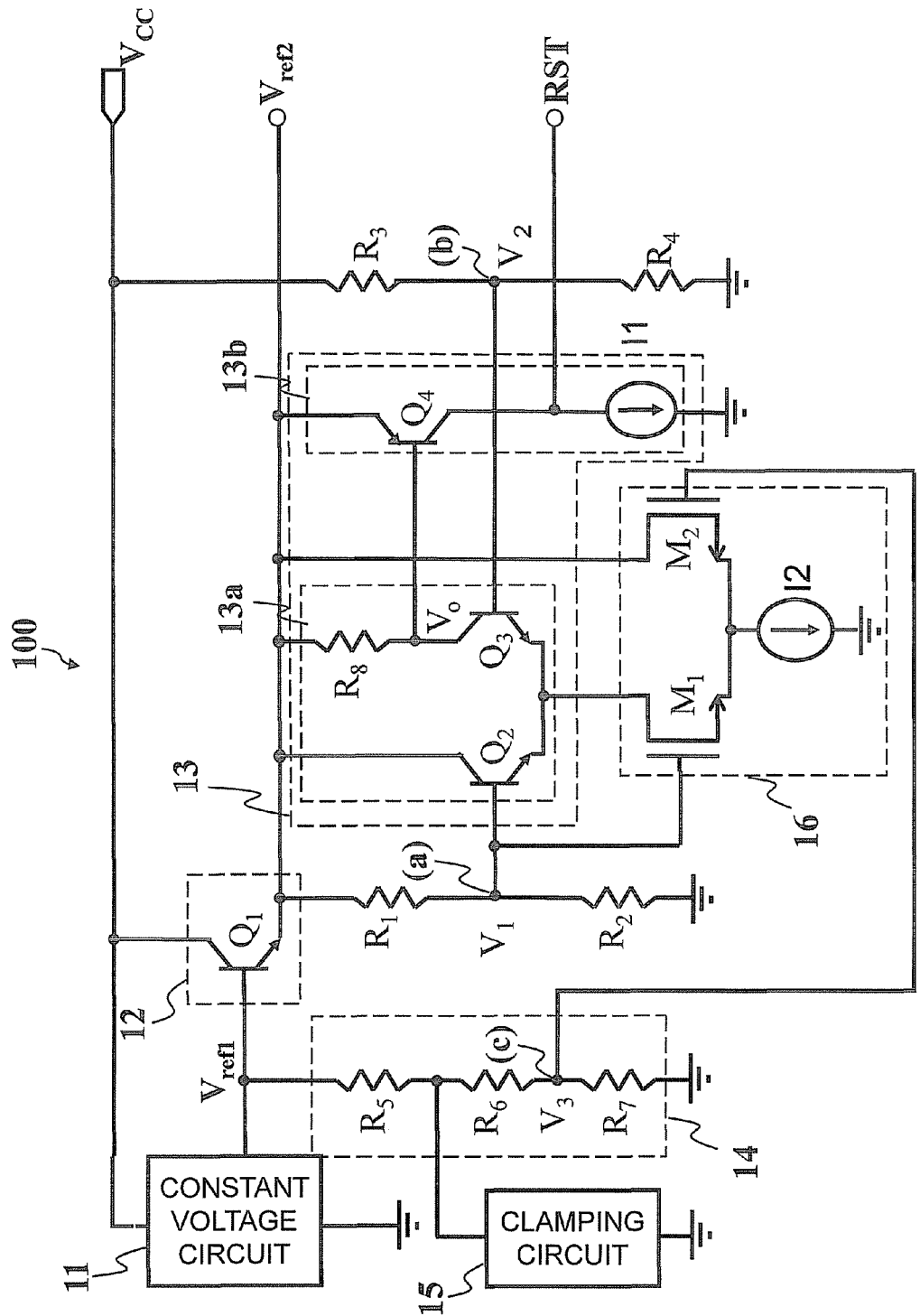
FIG. 1 is a circuit diagram showing the configuration of a power supply voltage monitor circuit according to a first embodiment.

Hereinbelow, embodiments of the present invention will be described by referring to the drawings.

First Embodiment

FIG. 1 is a circuit diagram illustrating the configuration of a power supply voltage monitor circuit 100 according to a first embodiment.

The power supply voltage monitor circuit 100 includes a constant voltage circuit 11 outputting a constant voltage Vref1, a level shift circuit 12 connected to the constant voltage circuit 11, a first differential circuit 13 receiving a voltage V1 and a voltage V2 and outputting an RST signal, the voltage V1 obtained by subjecting an output constant voltage Vref2 of the level shift circuit 12 to resistive division, the voltage V2 obtained by subjecting a power supply voltage Vcc to resistive division a divider circuit 14 whose one side is connected to the constant voltage circuit 11 and whose other side is grounded a clamping circuit 15 whose one side is connected to the divider circuit 14 and whose other side is grounded and a second differential circuit 16 receiving the voltage V1 and part of a voltage subjected to voltage division by the divider circuit 14.

The constant voltage circuit 11 may be a known constant voltage circuit including at least one Zener diode and collector-base short transistor. Upon input of the power supply voltage Vcc, the constant voltage circuit 11 outputs the constant voltage Vref1 that contributes to stabilizing the circuit operation.

The level shift circuit 12 is a circuit formed of at least one transistor and shifting the constant voltage Vref1, which is outputted from the constant voltage circuit 11, to the constant voltage Vref2. In this embodiment, the level shift circuit 12 is described as a circuit including a single transistor Q1 for the sake of simple explanation, but may be one with two transistors connected to each other in the Darlington configuration, for example. Alternatively, the level shift circuit 12 may be a circuit employing grounded-collector configuration. In the case where the level shift circuit 12 includes a single transistor as in this embodiment, the constant voltage Vref2 to be output is the constant voltage Vref1 undergoing level shift by 1×Vbe. This is due to an influence of the current/voltage characteristics of the transistor.

The first differential circuit 13 receives the voltage V1 obtained by subjecting the constant voltage Vref2 to resistive division, as well as the voltage V2 obtained by subjecting the power supply voltage Vcc to resistive division. Then, the first differential circuit 13 discriminates the potential difference between the voltages V1 and V2, amplifies a voltage V0 corresponding to this potential difference, and performs digital conversion thereon. Thereafter, according to the result of the comparison, the first differential circuit 13 outputs a H-level or L-level RST signal. In this embodiment, the first differential circuit 13 is formed of: a differential unit 13a including two NPN-type transistors Q2 and Q3 and a resistor R5; and an output unit 13b including an NPN-type transistor Q4 and a constant current source I1. Specifically, the differential unit 13a is formed of: the transistor Q2 whose collector electrode is connected to an output terminal of the level shift circuit 12 and whose base electrode is connected to both the resistors R1 and R2 at a node therebetween; the transistor Q3 whose emitter electrode is connected to the emitter electrode of the transistor Q2 and whose base electrode is connected to both the resistors R3 and R4 at a node b therebetween; and the resistor R5 whose one side is connected to the collector electrode of the transistor Q3 whose other side is connected to an output terminal of the level shift circuit 12. The output unit 13b is formed of: the transistor Q4 whose base electrode is connected to the collector electrode of the transistor Q3 and whose collector electrode is connected to the output terminal of the level shift circuit 12; and the constant current source I1 whose one side is connected to the emitter electrode of the transistor Q4 and whose other side is grounded. This embodiment assumes a power supply voltage monitor circuit with a UVLO function, and therefore a L-level RST signal is outputted while V1>V2 whereas a H-level RST signal is outputted while V1<V2. In addition, a L-level RST signal is outputted while no tail current is being generated in the constant current source 11.

Note that in FIG. 1, the resistor R5 is connected to the base electrode of the transistor Q4 for the sake of simple explanation; however, a transistor forming a mirror circuit in cooperation with the transistor Q4 may be used instead of the resistor R5 in order to maintain a stable output with a simple circuit configuration. Moreover, FIG. 1 illustrates a simple circuit including the transistor Q4 and the constant current source 11 as the output circuit to output the RST signals; however, a rail-to-rail amplifier, for example, may be connected so that the voltage V0, which is small, can be taken out nearly up to the power supply voltage. Furthermore, the constant current source I1 may be a resistor of a large resistance.

The divider circuit 14 includes resistors R6, R7, and R8. In this embodiment, the clamping circuit 15 is connected to a node between the resistors R6 and R7, and one of input terminals of the second differential circuit 16 to be described later is connected to a node c between the resistors R7 and R8. In the following, the voltage at this node c will be referred to as a voltage V3.

The clamping circuit 15 is a circuit so configured that when the voltage Vref1 outputted from the constant voltage circuit 11 reaches or exceeds a predetermined voltage, the clamping circuit 15 fixes and maintains that voltage (hereinafter, clamping voltage). The clamping circuit 15 may be formed of a coupling capacitor, a diode used for clamping and serving as a load of the circuit, and a discharging resistor, or may be formed of multiple diodes connected in series. As mentioned previously, the clamping circuit 15 is connected to both the resistors R6 and R7 at their node. In the following, the voltage at the node between the resistors R6 and R7 will be referred to as a voltage Vcl.

The second differential circuit 16 receives the voltage V1 and the voltage V3 that is obtained by subjecting the voltage Vcl to resistive division using the resistors R7 and R8. The second differential circuit 16 discriminates the potential difference between the voltages V1 and V3. Then, depending on this potential difference, the second differential circuit 16 switches the ON/OFF of a constant current source 12 to thereby switch the ON/OFF of the output of the first differential circuit 13. Specifically, the second differential circuit 16 is formed of a first MOS transistor M1 and a second MOS transistor M2, which are n-type MOS transistors, and the constant current source 12. Each of these first and second transistors M1 and M2 may be an NPN-type transistor. In this embodiment, the gate electrode of the first transistor M1 is connected to the node a between the resistors R1 and R2, whereas the drain electrode thereof is connected to both the emitter electrodes of the transistors Q2 and Q3. The gate electrode of the second transistor M2 is connected to the node c between the resistors R7 and R8 of the divider circuit 14, whereas the drain electrode thereof is connected to the output terminal of the level shift circuit 12.

Hereinbelow, description will be given of predetermined conditions for turning on/off the first and second MOS transistors M1 and M2 of the second differential circuit 16.

First of all, to turn off the first transistor M1 and turn on the second transistor M2 so as to cause the constant current of the constant current source 12 to flow through the second transistor M2 side, it is necessary to set each resistance value to such a value as to make the voltage V1 smaller than the voltage V3. Then, first, the voltage Vref1 to be outputted from the constant voltage circuit 11 is shifted to the constant voltage Vref2 by the level shift circuit 12. Specifically, the constant voltage Vref2 is shifted to be smaller than the constant voltage Vref1 by 1×Vbe, due to an influence of the current/voltage characteristics of the transistor Q1. For this reason, the relationship between the constant voltages Vref1 and Vref2 is theoretically defined as $$Vref1 = Vref2 + Vbe, \text{ and therefore}$$

$$Vref1 > Vref2.$$

The voltage V1 to be applied to the gate electrode of the first transistor M1 is defined as $$V1 = Vref2 \times \{R2/(R1+R2)\}, \text{ and}$$

the voltage V3 to be applied to the gate electrode of the second transistor M2 is defined as $$V3 = Vcl \times \{R8/(R7+R8)\}$$
$$= Vref1 \times \{R8/(R6+R7+R8)\}$$
$$= (Vref2 + Vbe) \times \{R8/(R6+R7+R8)\}.$$

The values of the resistors R1 to R8 are set in advance to such values as to make the voltage V1 smaller than the voltage V3.

In addition, the voltage Vcl is defined as $$Vcl = Vref1 \times \{(R7+R8)/(R6+R7+R8)\},$$

and thus the voltage Vcl is substantially proportional to the constant voltage Vref1. Accordingly, there is a condition that the voltage Vcl is not fixed by the clamping circuit 15 while V1<V3. By this configuration, the second transistor M2 is turned on and the constant current of the constant current source 12 flows through the second transistor M2 side. As a result of this, the collector current to be inputted to each of the transistors Q3 and Q4 is small, and therefore a L-level RST signal is outputted.

Next, to turn on the first transistor M1 and turn off the second transistor M2 so as to cause the constant current of the constant current source 12 to flow through the first transistor M1 side, it is necessary to set each resistance value to such a value as to make the voltage V1 larger than the voltage V3. However, the relationship Vref1>Vref2 is always maintained, and thus the clamping circuit 15 is caused to operate so that the value of the voltage Vcl may be set to the value of a clamping voltage independent of the constant voltage Vref1. In other words, in order for V1>V3, the voltage Vcl is fixed at a clamping voltage and each resistance value is set such that all the following relationships are secured at the same time:

$$Vref1 > Vref2$$

$$Vref2 \times \{R2/(R1+R2)\} > Vref1 \times \{R8/(R6+R7+R8)\}$$

$$Vref2 \times \{R2/(R1+R2)\} > Vcl \times \{R8/(R7+R8)\}.$$

By this configuration, the second transistor M2 is turned off, and the first transistor M1 switches the constant current source 12 to an ON state. Here, the voltages V1 and V2 to be inputted to the respective transistors Q2 and Q3 of the first differential circuit 13 are defined as $$V1 = Vref2 \times \{R2/(R1+R2)\}$$

$$V2 = Vcc \times \{R4/(R3+R4)\}.$$

The first differential circuit 13 makes a comparison between these voltages V1 and V2 and outputs an RST signal. Specifically, in a case of V1>V2, the transistor Q4 is turned off, and a L-level RST signal is outputted. On the other hand, in a case of V1<V2, the transistor Q4 is turned on, and a H-level RST signal is outputted.

FIGS. 2A and 2B are waveform diagrams showing the output characteristics of the power supply voltage monitor circuit 100 according to this embodiment of the present invention. FIG. 2A is a characteristic chart showing the rise characteristics of the voltages V1 and V2 in a case of increasing the power supply voltage Vcc from 0 V. FIG. 2B is a timing chart showing the RST signal in the same case.

Figure 2:
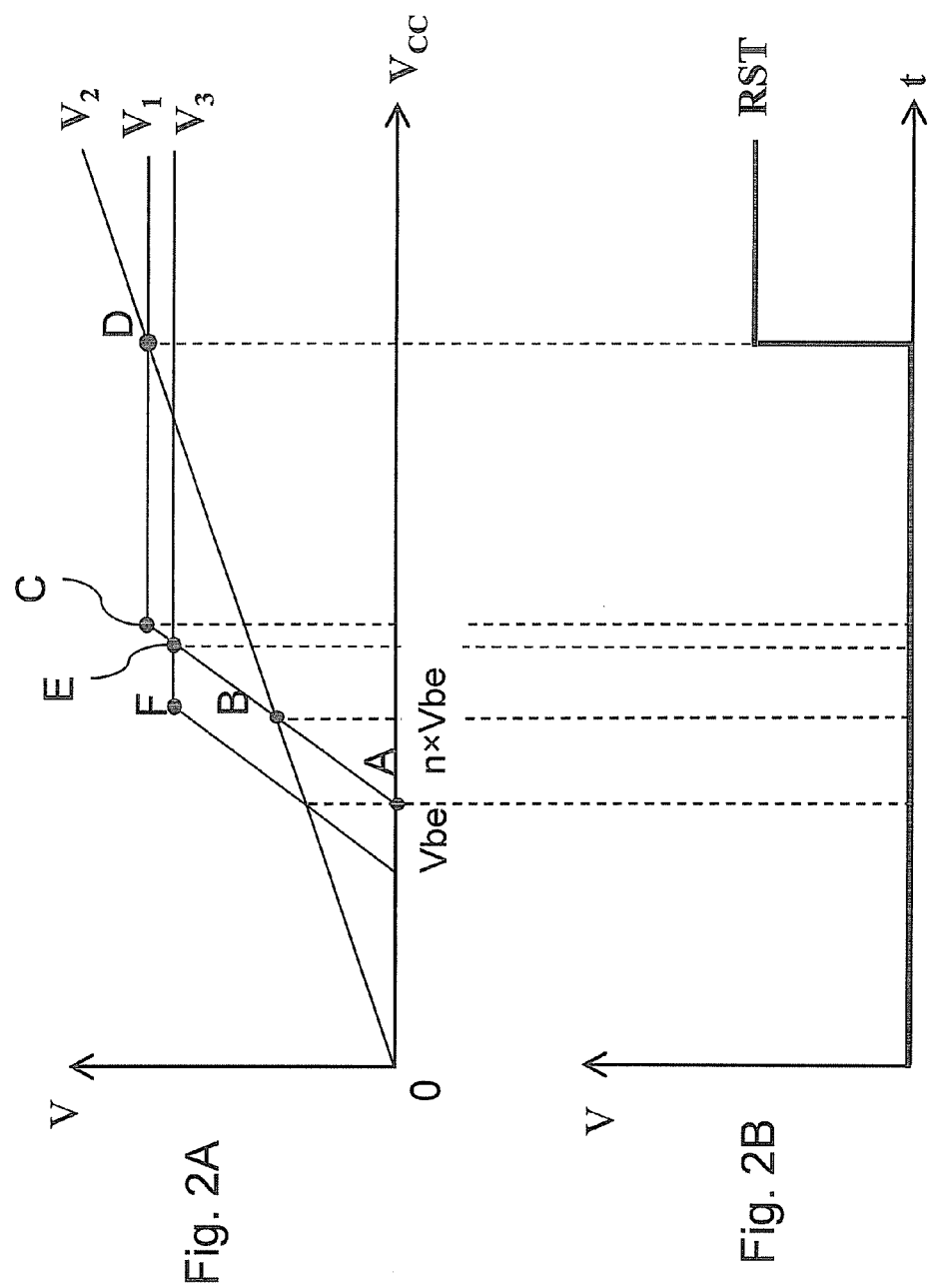
FIGS. 2A and 2B are diagrams showing an operation of the power supply voltage monitor circuit according to the first embodiment.

An operation of the power supply voltage monitor circuit 100 having the configuration of FIG. 1 will be described by referring to FIGS. 1 to 2B. Immediately after the power supply voltage Vcc increases from 0 V, the voltage V2 shows an increase which is substantially proportional to the increase of the power supply voltage Vcc. In contrast, the voltage V1, which is obtained by subjecting the constant voltage Vref2 to resistive division, does not rise immediately, and rises when the power supply voltage Vcc becomes n (n is an integer) times as large as the base-emitter voltage Vbe (point A). This is because the voltage V2 is one obtained by subjecting the power supply voltage Vcc to the voltage division, while the voltage V1 is a voltage potential having received influences of the current/voltage characteristics of the transistors given to the constant voltage circuit 11, the level shift circuit 12, and the like. As described above, the constant voltage circuit 11 has a complicated structure with multiple transistors, in order to maintain the constant voltage Vref1 for handling the outdoor air temperature and device characteristic variations of resistors and the like; however, the fact that the voltage V1 rises at the time when the power supply voltage Vcc becomes n times as large as Vbe remains the same.

Now, description will be given of a period in which the voltage V1<the voltage V2, i.e., a period from the point A to a point B shown in FIG. 2A. Note that the divider circuit 14 including the resistors R6, R7, and R8 is connected directly to the constant voltage circuit 11, and thus receives the Vref1 which is higher, by 1×Vbe, than the constant voltage Vref2 outputted from the transistor Q1. Accordingly, by the time (point A) the voltage V1 starts to increase, the voltage V3 has already increased at the point A, resulting in the voltage V1<the voltage V3 and turning on the second MOS transistor M2. As a result, the constant current of the constant current source 12 flows through the second transistor M2 side. Then, the transistors Q3 and Q4 of the first differential circuit 13 are turned on, but since the collector current to be inputted is small, the RST signal is at the L-level.

Next, description will be given of a period in which the voltage V1>the voltage V2, i.e., a period from the point B to a point D shown in FIG. 2A. As the power supply voltage Vcc increases, the potentials of the voltages V1 and V2 intersect each other at the point B, leading to the voltage V1>the voltage V2. Meanwhile, as to the relationship between the voltages V1 and V3, while the voltage V1<the voltage V3, i.e., during a period between the point B and a point E, the second transistor M2 is kept in the ON state and the first transistor M1 is kept in the OFF state, whereby the RST signal is kept at the L-level. However, as the power supply voltage Vcc increases further, the potential of the voltage V3 is fixed by the clamping circuit 15 to a value obtained by subjecting the clamping voltage Vcl to resistive division (point F). For this reason, the potential difference between the voltages V1 and V3 changes (point E), resulting in the voltage V1>the voltage V3. Accordingly, the second transistor M2 is turned off, and the first transistor M1 is turned on. Thereby, the first differential circuit 13 operates, and the RST signal is outputted.

Here, the relationship between the voltages V1 and V2 is the voltage V1>the voltage V2, the transistors Q3 and Q4 are turned off, and the RST signal is kept at the L level. In addition, the point E at which the voltages V1 and V3 intersect each other exists always between the points B and C on the voltage V1. Therefore, the point C at which the voltage V1 becomes stable can be detected easily.

After the voltage V1<the voltage V2, i.e., after a point D, a relationship the voltage V2>the voltage V1>the voltage V3 is maintained. Accordingly, the constant current of the constant current source 12 flows through the first MOS transistor M1, whereby the first MOS transistor M1 is turned on and a voltage is supplied to the first differential circuit 13. Here, the relationship between the voltages V1 and V2 is the voltage V1<the voltage V2, and thus the transistors Q3 and Q4 are turned on, and the RST signal changes to the H level.

As described above, according to this embodiment, until the voltage clamping is performed by the clamping circuit 15, the first differential circuit 13 is forcedly turned off depending on the potential difference of the two constant voltages, namely, the first and second constant voltages Vref1 and Vref2, and a L-level RST signal is outputted. On the other hand, after the voltage clamping is performed by the clamping circuit 15, the potential difference comparison between the first constant voltage Vref1 and the power supply voltage Vcc is made by the first differential circuit 13 and a H-level RST signal or a L-level RST signal can be outputted. Accordingly, erroneous output by the first differential circuit 13 can be prevented with a simple circuit configuration. In addition, by monitoring the voltage V3 obtained by subjecting the clamping voltage of the clamping circuit 15 to resistive division, the point at which the voltage V1 becomes stable can be detected easily. Thus, the power supply voltage monitor circuit according to this embodiment is independent of unstable changes in the slope of the waveform of the power supply circuit, and also can reduce the dependence of such an event on the power supply voltage Vcc. Furthermore, it is possible to achieve a power supply voltage monitor circuit with a high design freedom and a high reliability.

Note that in this embodiment, the level shift circuit 12 includes a single transistor Q1, and therefore the potential difference between the constant voltages Vref1 and Vref2 is 1×Vbe; however, if the level shift circuit 12 includes, for example, two transistors, the potential difference between the constant voltages Vref1 and Vref2 is 2×Vbe. The number of transistors, the resistance values, and the number of clamping diodes should be adjusted as appropriate on the basis of correlations with the slopes of the voltages V1, V2, and V3 accompanying with increase of the power supply voltage Vcc.

Second Embodiment

Figure 3:
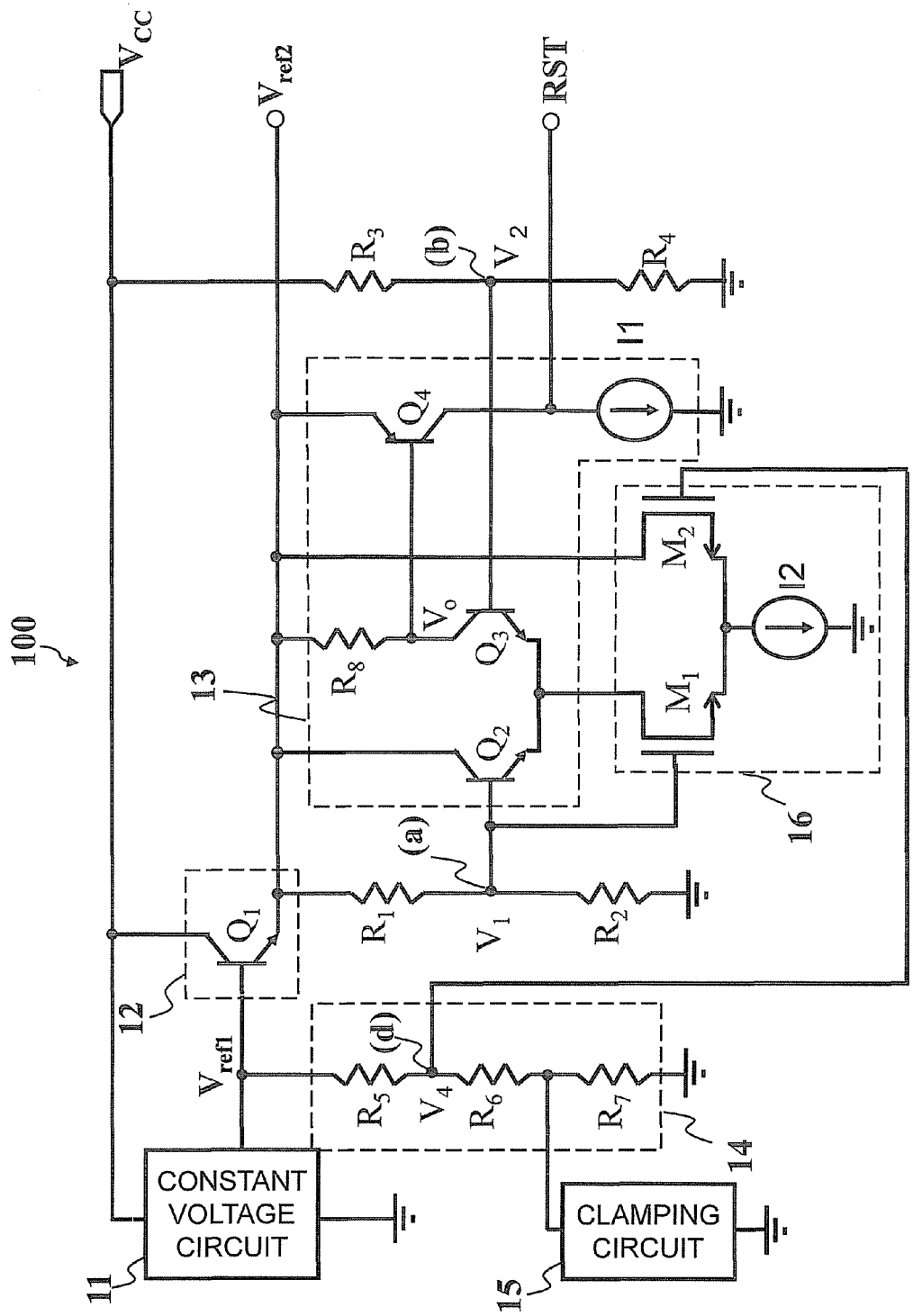
FIG. 3 is a circuit diagram showing the configuration of a power supply voltage monitor circuit according to a second embodiment.

FIG. 3 is a circuit diagram illustrating the configuration of a power supply voltage monitor circuit 100 according to a second embodiment. In this embodiment, the gate electrode of the second transistor M2 is connected to a node d between the resistors R6 and R7, and a diode D1 is connected to the node between the resistors R7 and R8. In the following, the voltage at the node d between the resistors R6 and R7 will be referred to as a voltage V4, and the voltage at the node between the resistors R7 and R8 will be referred to as a voltage Vd.

Until a certain voltage is supplied to the diode D1, i.e., during a period in which a relationship of the constant voltage Vref1>the constant voltage Vref2 is maintained, the voltage potential of the voltage V4 is maintained as $V4 = V\text{ref}1 \times \{(R7+R8)/(R6+R7+R8)\}$.

However, when the constant voltage Vref1 becomes a predetermined value, the voltage potential of the voltage V4 changes to $V4 = (V\text{ref}1 - Vd) \times \{R7/(R6+R7)\}$ due to an influence of the voltage/current characteristics of the diode D1.

Figures 4A, 4B:
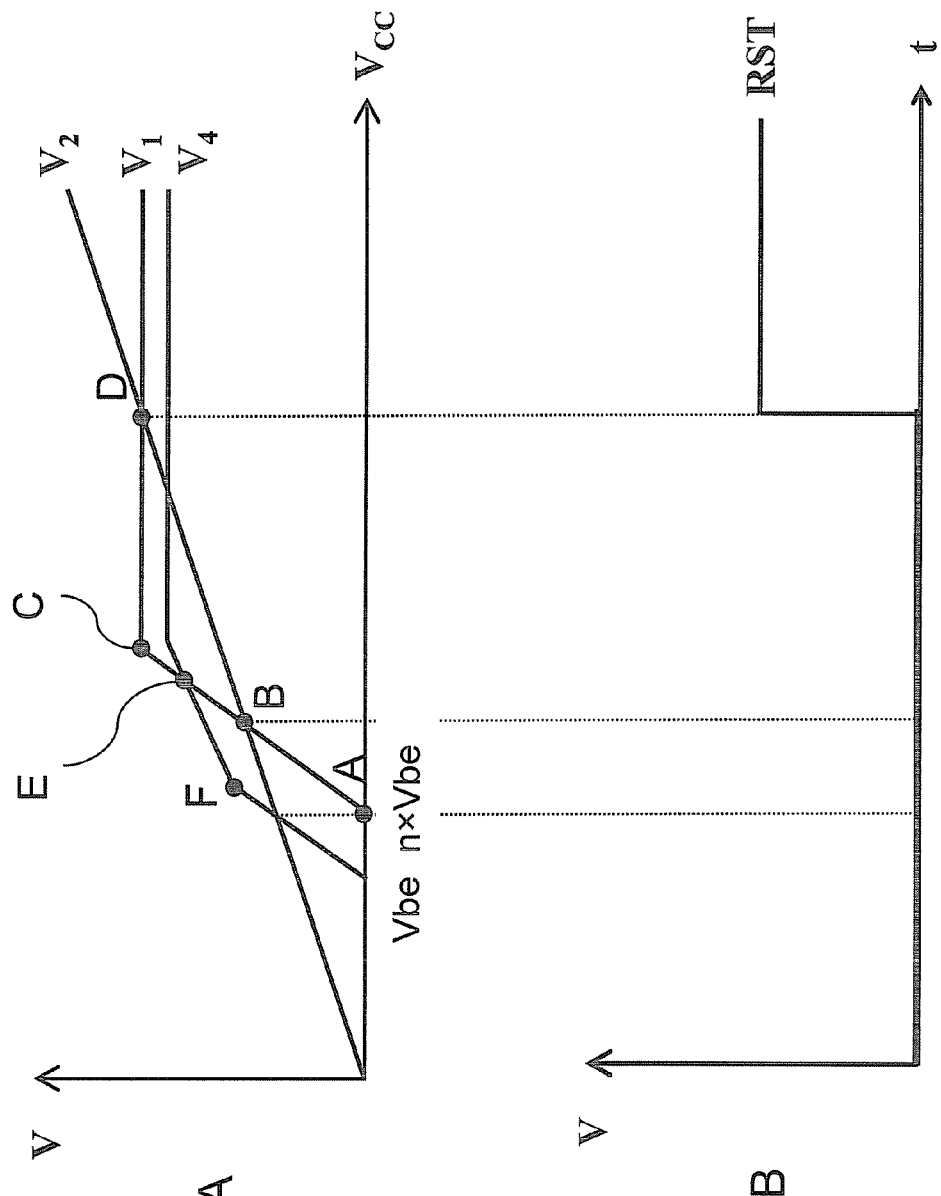
FIGS. 4A and 4B are diagrams showing an operation of the power supply voltage monitor circuit according to the second embodiment.
Figure 5:
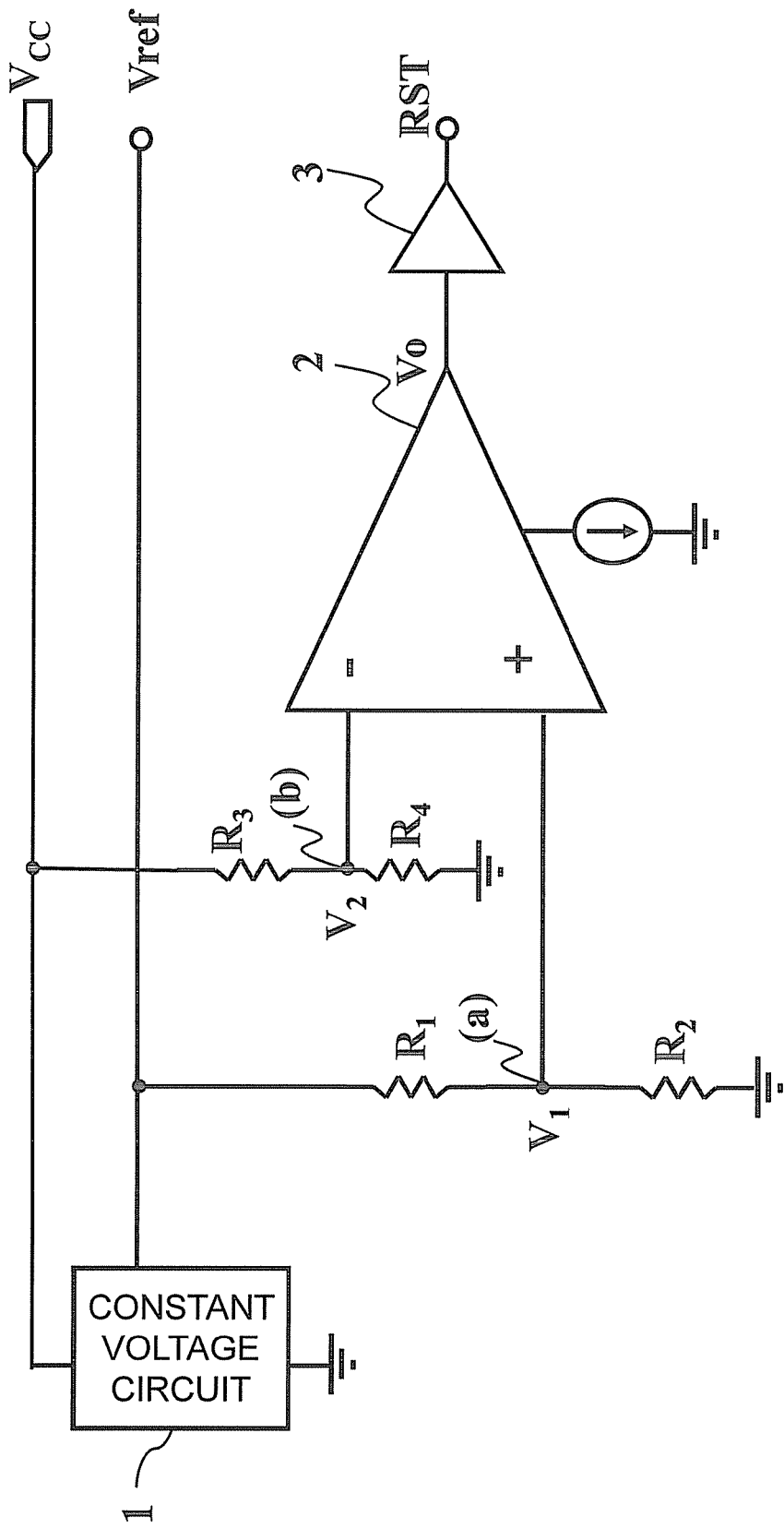
FIG. 5 is a circuit diagram showing one example of a power supply voltage monitor circuit with a conventional circuit configuration.
Figures 6A, 6B:
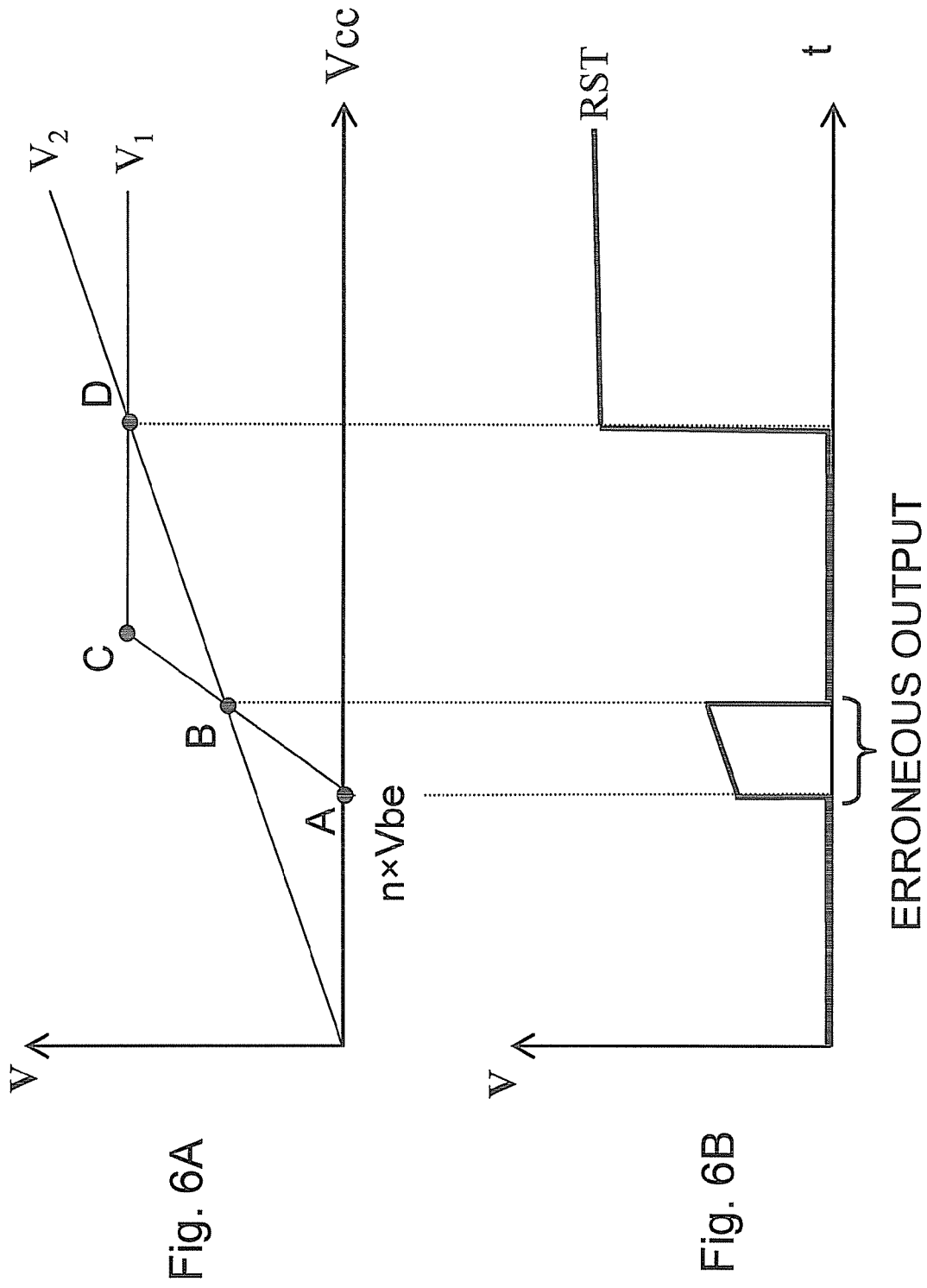
FIGS. 6A to 6B are diagrams showing an operation of the conventional power supply voltage monitoring circuit.

By referring to FIGS. 3 to 4B, an operation of the power supply voltage monitor circuit 100 having the configuration of FIG. 3 will be described. Immediately after the power supply voltage Vcc starts to increase from 0 V, the voltage V2 shows an increase substantially proportional to the increase of the power supply voltage Vcc. In contrast, the voltage V1 does not rise immediately, and rises when the power supply voltage Vcc becomes n (n is an integer) times as large as the base-emitter voltage Vbe (point A).

Now, description will be given of a period in which the voltage V1<the voltage V2, i.e., a period from the point A to a point B. Note that the divider circuit 14 including the resistors R6, R7, and R8 is connected directly to the constant voltage circuit 11, and thus receives the voltage potential which is higher, by 1×Vbe, than the internal constant voltage Vref2. Accordingly, by the time (point A) the voltage V1 starts to increase, the voltage V4 has already increased at the point A, resulting in the voltage V2<the voltage V4 and turning on the second transistor M2. Then, since the collector current to be inputted into each of the transistors Q3 and Q4 of the first differential circuit 13 is small, the RST signal is at the L-level.

Here, the voltage V4 in this embodiment is at the node d between the resistors R6 and R7 and thus receives an influence of the voltage Vd of the diode D1 connected to the node between the resistors R7 and R8. Thus, the diode D1 becomes stable and is turned on at a point F, but as the power supply voltage Vcc continues to increase, the slope of the voltage V4 becomes gentle because of the voltage characteristics of the diode D1, and forms an intersecting point E with the voltage V1. The voltage V4 becomes fixed in a similar manner as the voltage V1 becoming fixed at a point C. The rise characteristics of the voltages V1 and V2 after being fixed are similar to those in the case of the first embodiment.

An excellent feature of this embodiment is that the potential difference between the points E and C is dependent on a temperature change of only Vbe×1 and that the points E and C can be located close to each other. Accordingly, the point at which the voltage V1 becomes stable can be detected more accurately by use of a simple circuit with fewer components.

Note that the present invention is not to be limited only to the above-described embodiments, and can be implemented by modifying components as long as such modifications are carried out without departing from the gist of the invention. Moreover, various inventions can be made through appropriate combinations of multiple components disclosed in the above-described embodiments. For example, of all the components disclosed in the embodiments, some components may be omitted. Further, a component in one embodiment may be combined with a component in another embodiment as appropriate.

What is claimed is:

1. A power supply voltage monitor circuit comprising:
   a constant voltage circuit receiving a power supply voltage and outputting a first constant voltage;
   a level shift circuit receiving the first constant voltage and outputting a second constant voltage obtained by subjecting the first constant voltage to level shift;
   a clamping circuit receiving the first constant voltage and fixing the received first constant voltage at a clamping voltage;
   a first differential circuit including
      a differential unit receiving a constant current supplied from a current source and outputting an output voltage in accordance with a potential difference between a first input voltage obtained by subjecting the second constant voltage to resistive division and a second input voltage obtained by subjecting the power supply voltage to resistive division, and
      an output unit outputting a rectangular signal in accordance with the output voltage of the differential unit; and
   a second differential circuit which, in a case where the clamping circuit does not fix the first constant voltage, turns off the current source of the differential unit depending on a potential difference between the first constant voltage and the first input voltage to control the output operation of the output unit, whereas in a case where the clamping circuit fixes the first constant voltage, turns on the current source of the differential unit depending on a potential difference between the clamping voltage and the first input voltage.

2. The power supply voltage monitor circuit according to claim 1, wherein in a case where the clamping circuit does not fix the first constant voltage, the second differential circuit turns off the current source of the differential unit depending on the potential difference between the first constant voltage and the first input voltage to thereby change the rectangular signal to be outputted from the output unit to a L level.

3. The power supply voltage monitor circuit according to claim 1, wherein in a case where the clamping circuit fixes the first constant voltage and the first input voltage is smaller than the second input voltage, the second differential circuit turns on the current source of the differential unit depending on the potential difference between the clamping voltage and the first input voltage and the first differential circuit changes the rectangular signal to be outputted from the output unit to a H level.

4. The power supply voltage monitor circuit according to claim 1, wherein in a case where the clamping circuit fixes the first constant voltage and the first input voltage is larger than the second input voltage, the second differential circuit turns on the current source of the differential unit depending on the potential difference between the clamping voltage and the first input voltage and the first differential circuit changes the rectangular signal to be outputted from the output unit to a L level.

5. A power supply voltage monitor circuit comprising:
   a constant voltage circuit receiving a power supply voltage and outputting a first constant voltage;
   a level shift circuit receiving, via an input terminal thereof, the first constant voltage from the constant voltage circuit and outputting, from an output terminal thereof, a second constant voltage obtained by subjecting the first constant voltage to level shift;
   a first differential circuit including
      a differential unit provided with
         a first transistor whose collector electrode is connected to the output terminal of the level shift circuit and whose base electrode is connected to both of a resistor R1 and a resistor R2 at a node therebetween,
         a second transistor whose emitter electrode is connected to an emitter electrode of the first transistor and whose base electrode is connected to both of a resistor R3 and a resistor R4 at a node therebetween, and
         a resistor R5 whose one side is connected to a collector electrode of the second transistor and whose other side is connected to the output terminal of the level shift circuit, and
      an output unit provided with
         a third transistor whose base electrode is connected to the collector electrode of the second transistor and whose collector electrode is connected to the output terminal of the level shift circuit, and
         a first constant current source whose one side is connected to an emitter electrode of the third transistor and whose other side is grounded;
   a divider circuit including
      a resistor R6 whose one side is connected to the input terminal of the level shift circuit and whose other side is connected to a resistor R7,
      the resistor R7 whose one side is connected to the resistor R6 and whose other side is connected to a resistor R8, and
      the resistor R8 whose one side is connected to the resistor R7 and whose other side is grounded;
   a clamping circuit connected to both of the resistors R6 and R7 at a node therebetween; and
   a second differential circuit including
      a first MOS transistor whose gate electrode is connected to the base electrode of the first transistor and whose drain electrode is connected to both of the emitter electrodes of the first and second transistors,
      a second MOS transistor whose gate electrode is connected to both of the resistors R7 and R8 at a node therebetween and whose drain electrode is connected to the output terminal of the level shift circuit, and
      a second constant current source connected to both of source electrodes respectively of the first and second MOS transistors.

6. The power supply voltage monitor circuit according to claim 5, wherein
   the clamp circuit include at least one diode connected to both of the resistors R7 and R8 at the node therebetween, and
   the gate electrode of the second MOS transistor is connected to both of the resistors R6 and R7 at the node therebetween.

* * * * *